United States Patent
Teok

[11] Patent Number: 5,996,831
[45] Date of Patent: Dec. 7, 1999

[54] CLOSURE DEVICE

[75] Inventor: Khwa Peng Teok, Singapore, Singapore

[73] Assignee: Sphinx Elektronik GmbH, Waldkirch, Germany

[21] Appl. No.: 09/111,459

[22] Filed: Jul. 7, 1998

Related U.S. Application Data

[63] Continuation of application No. PCT/IB97/01460, Nov. 6, 1997.

[51] Int. Cl.[6] .................................................. B65D 51/00
[52] U.S. Cl. ................ 220/230; 220/345.2; 220/345.3; 220/345.4; 292/251.5; 70/276
[58] Field of Search ................ 220/230, 345.2, 220/345.3, 345.4; 292/251.5; 70/276

[56] References Cited

U.S. PATENT DOCUMENTS

| | | |
|---|---|---|
| 1,628,525 | 5/1927 | Bell . |
| 3,744,833 | 7/1973 | Berducone .......................... 292/251.5 |
| 3,837,525 | 9/1974 | Kobayashi . |
| 4,110,552 | 8/1978 | Lombardi ............................ 220/230 X |
| 4,223,799 | 9/1980 | Eyster et al. ............................ 220/230 |
| 4,470,518 | 9/1984 | Stein ................................. 220/345.2 X |
| 4,489,842 | 12/1984 | Bobrove ................................... 215/213 |
| 4,848,812 | 7/1989 | Slaughter . |
| 5,129,538 | 7/1992 | Bennett ............................. 220/345.2 X |
| 5,263,576 | 11/1993 | Boreen et al. .................... 220/345.2 X |
| 5,409,275 | 4/1995 | Yoshida et al. ...................... 220/230 X |

FOREIGN PATENT DOCUMENTS

| | | |
|---|---|---|
| 0 484 294 A1 | 5/1992 | European Pat. Off. . |
| 2086962 | 12/1971 | France . |
| 92 06 641 | 7/1992 | Germany . |
| 296 08 923 | 8/1996 | Germany . |
| 308 522 | 10/1955 | Switzerland . |
| 174156 | 2/1922 | United Kingdom . |
| 2282636 | 4/1995 | United Kingdom . |

*Primary Examiner*—S. Cronin
*Attorney, Agent, or Firm*—Henry M. Feiereisen

[57] ABSTRACT

A closure device for a case of an antimagnetic material comprising a box part (1) and a sliding lid (5) requires neither in the lid nor in the box part break-throughs and offers high security against unauthorized opening of the case when at least one permanent magnetic locking pin (4a, 4b) is arranged slideable in the box part (1) at right angles to the plane of the lid (5), and is loaded in the direction of the lid (e.g. by means of a spring) so that the locking pin clasps behind a locking shoulder (6a, 6b; 66) configured on the inner side of the lid when closed. For opening the lid (5) an unlocking plate (7) may then be used comprising at the corresponding location a permanent magnet (8a, 8b) which is magnetized opposite the direction of magnetization of the locking pin (4a, 4b).

7 Claims, 4 Drawing Sheets

CLOSURE DEVICE

CROSS-REFERENCES TO RELATED APPLICATIONS

This application is a continuation of prior filed copending international PCT application Appl. No. PCT/IB97/01460, filed Nov. 6, 1997.

BACKGROUND OF THE INVENTION

The invention relates to a closure device for a case of an antimagnetic material comprising a box part and a sliding lid, including at least one permanent magnetic locking pin slideable in the box part at right angles to the plane of the lid, loaded in the direction of the lid, this locking pin clasping behind a locking shoulder configured on the inner side of the sliding lid when closed.

One such closure device is known from French Pat. No. 2 086 962. This closure device can be opened only by personnel acquainted with its function by means of a permanent magnet or solenoid which is placed on the lid and magnetized in the opposite sense to that of the permanent magnetic locking pin. A case having this closure device is suitable for tamperproof security means e.g. for locks on locker or glass doors as well as instrument enclosures. Since the closure device requires no break-throughs in the case the case can be rendered waterproof or at least splashproof at minimum expense.

This known closure device has, however, the disadvantage that a normal sliding lid needs to be pulled over its full length from the box part to gain access to the security items, thus involving a relatively bulky installation.

SUMMARY OF THE INVENTION

It is thus an object of the present invention to provide an improved closure device, obviating the afore-stated drawbacks.

In particular, it is an object of the present invention to provide an improved closure device which involves a substantially more compact installation as compared to known proposals.

These objects, and others which will become apparent hereinafter, are attained in accordance with the present invention by a lid having at two opposing longitudinal rims at least two laterally protruding tongues spaced away from each other respectively, whilst the box part is provided in the corresponding sidewalls with recesses adapted to the dimensions of the tongues, slide grooves receiving these tongues adjoining the recesses in the closing direction of the lid.

Now, to open the case the lid must not be pulled out over the full length of the box part but merely sufficiently so that the tongues of the lid align with the recesses in the sidewalls of the box part, the lid then being able to be lifted off at right angles to its large surface area from the box part.

So that the locking pin remains in the device on removal of the lid configured in accordance with the invention it is received expediently captive in an antimagnetic guide sleeve. The guide sleeve may be integral with an antimagnetic web suitable for sliding insertion into the box part. This last-mentioned feature is particularly of advantage as regards both production and assembly requirements.

In one special embodiment when the lid is closed the locking shoulder on the inner side of the lid is configured as the flank of a cam protruding in the direction of the interior of the case, the flank being oriented at right angles to the surface area of the lid.

It is expedient to provide a bevel which on sliding insertion movement of the lid urges the locking pin back into the box part until the locking shoulder has negotiated the locking pin. For this purpose either the, relative to the insertion sliding direction, front edge of the lid or the free face surface area of the locking pin can be configured wedge-shaped. In the latter instance the locking pin needs, however, to be guided non-rotatively. For this purpose it may have a cross-section other than circular. Instead of this, when the locking pin cooperates with a cam, the cam may have a bevel advancing in the insertion sliding direction which urges the locking pin back into the box part until the cam flank has negotiated the locking pin.

To conveniently and instantly bring the closure device into the unlocked position an unlocking plate having at least two positioning means cooperating with the lid and a permanent magnet arranged opposing the direction of magnetization of the locking pin can be expediently mounted on the lid. Where a rectangular or square case is concerned the positioning means may comprise two tabs formed on the unlocking plate which are arranged so that when coming into contact with two sidewalls of the box part at right angles to each other the permanent magnet of the plate is precisely located above the permanent magnetic locking pin. The positioning means may also comprise, however, for example, two or more noses configured on the plate, which in the correct position of the unlocking plate locate in complementary recesses provided in the outer surface area of the lid.

It will, of course, be appreciated that the proposed closure device is fitted out as a rule with more than one permanent magnetic locking pin, since due to its magnetic field a single locking pin is easy to locate even by an unauthorized person, whereas when several locking pins are used, incorporated magnetized partly with the same polarity and partly with opposing polarity relative to each other then it is practically impossible to urge all locking pins back simultaneously into their release position without a suitable unlocking plate. Furthermore, by employing several locking pins according to the principle known in locking systems closure devices can be provided with differing codes as well as families created and hierarchies defined.

The force loading the locking pin in the direction of the lid can be produced optionally by a coil compression spring arranged in the guide sleeve or by a permanent magnet active in opposite sense to the direction in which the locking pin is magnetized, the permanent magnet having unlike the use of a coil compression spring the advantage of being better resistant to corrosion should the case be used in a damp or wet indoor environment or exposed to the weather.

BRIEF DESCRIPTION OF THE DRAWING

The above and other objects, features and advantages of the present invention will now be described in more detail with reference to the accompanying drawing in which.

DETAILED DESCRIPTION OF PREFERRED EMBODIMENTS

Figure 1:
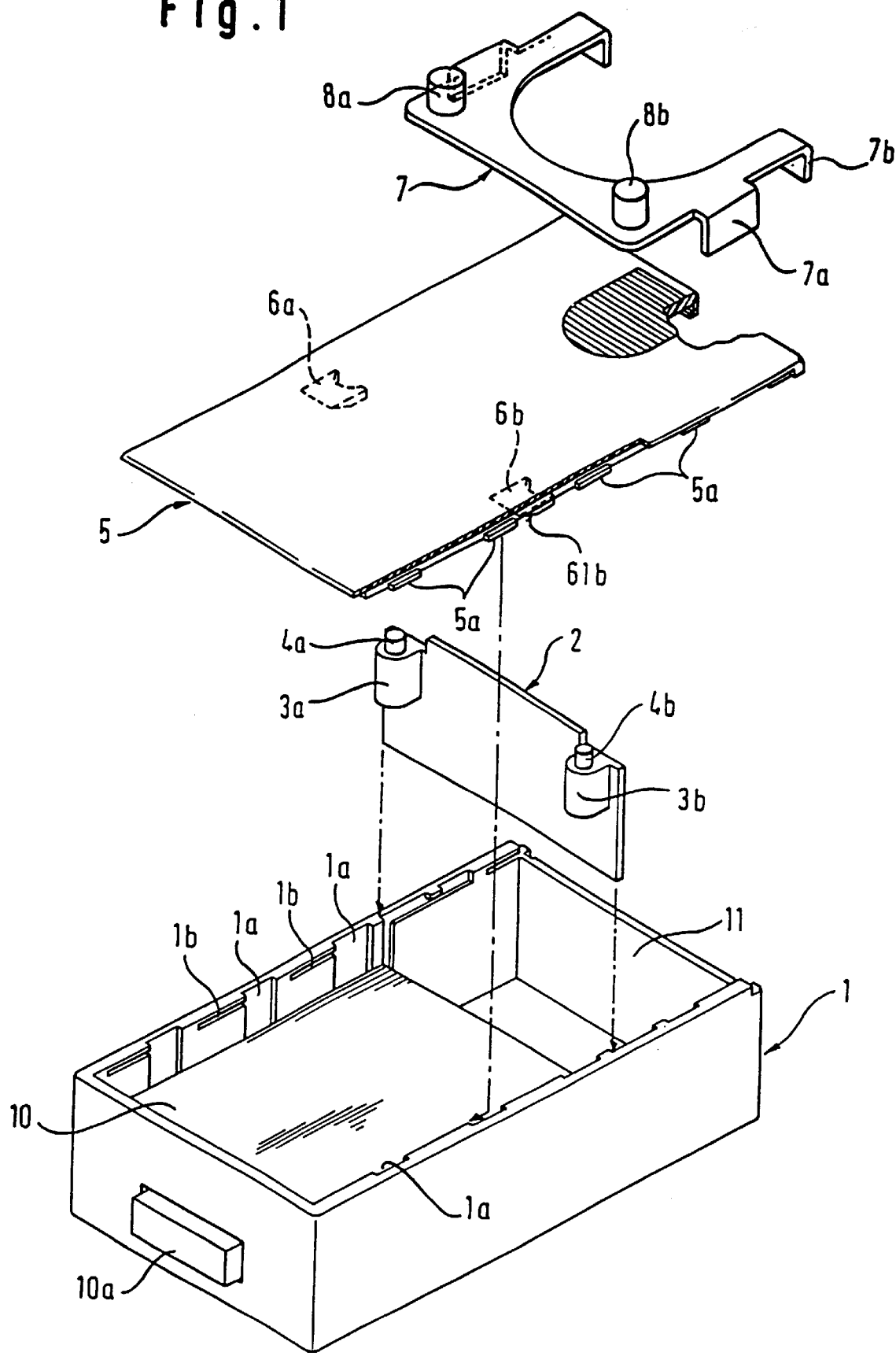
FIG. 1 is an exploded view of a case including the proposed closure device.
Figure 2:
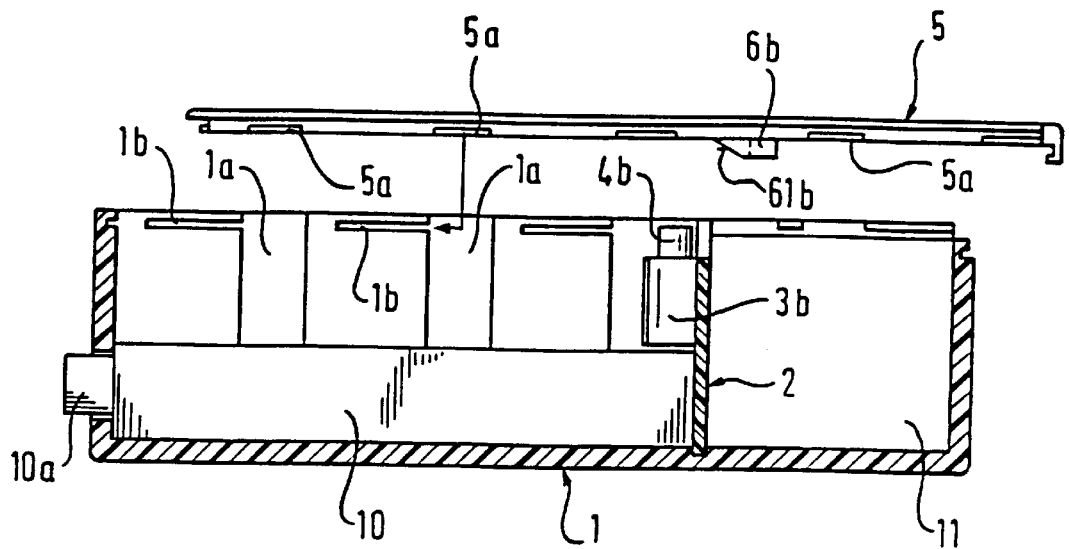
FIG. 2 is a longitudinal section through the case with the lid open.
Figure 3:
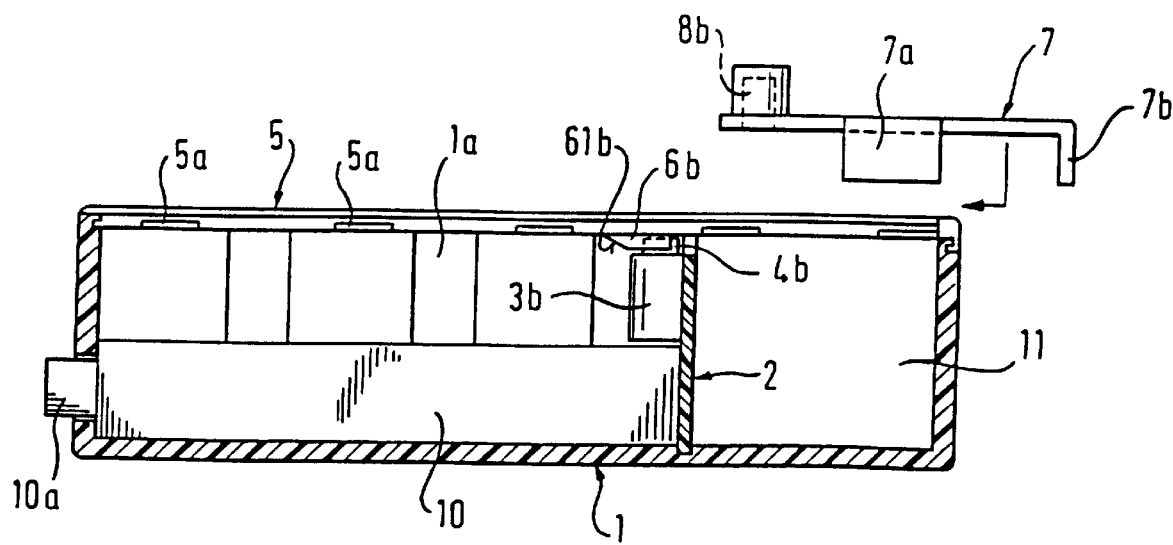
FIG. 3 is the same longitudinal section, but with the case fully closed and with the unlocking plate arranged above the lid.

FIGS. 1 to 3 show a case comprised of a box part 1, a cross web 2 including two formed sleeves 3a, 3b for receiving two locking pins 4a, 4b, a lid 5 having on its underside cams 6a, 6b and an unlocking plate 7 carrying two unlocking magnets 8a and 8b. Except for the latter and the two unlocking pins all parts of made of antiferromagnetic materials.

The sliding lid 5 features on its longitudinal rims five protruding tongues 5a corresponding to recesses 1a in the inner sides of the sidewalls of the box part 1. Adjoining these recesses 1a in the sliding direction of the lid 5 are slide grooves 1b.

The case may receive, for example, the lock 10 and dead bolt 10 as indicated. Remaining behind the cross web 2 in the case is a space 11 for receiving, for example, batteries as well as an electronic control circuit for the lock 10.

Figure 4:
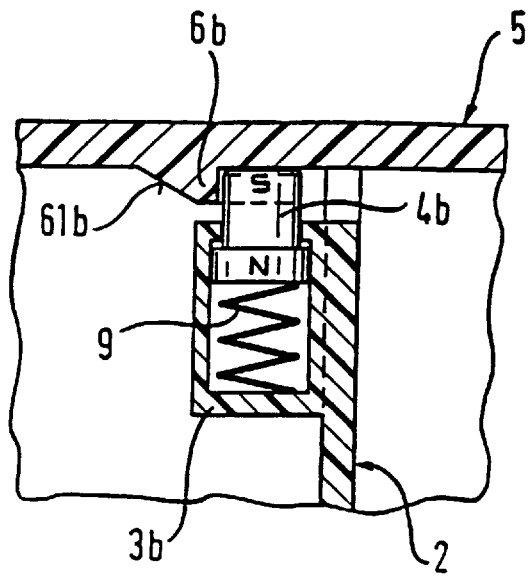
FIG. 4 is a magnified partial section at the level of a locking pin in its locking position.

FIG. 2 shows the lid 5 in the position in which it is placed on the box part 1 when the case is to be closed. After being placed on the box part 1, whilst the lid 5 is then shifted to the left to close the case, the advancing bevel 61b of the cam 6b urges the pin 4b back against the force of a spring 9 (cf. FIGS. 4 and 5) into its sleeve 3b until the rear, semicircular scalloped flank of the cam 6b has fully negotiated this pin 4b. The corresponding locking position is shown in FIG. 4.

Figure 5:
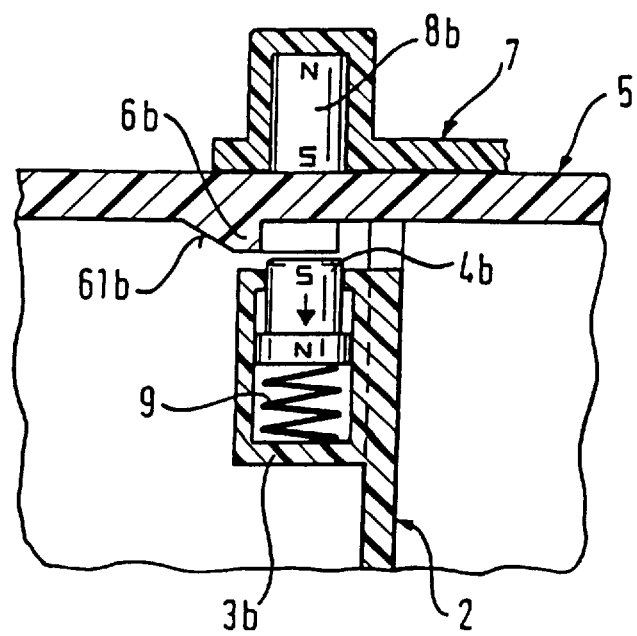
FIG. 5 is the same section as shown in FIG. 4 but showing the locking pin in the release position.

In the closed condition as shown in FIG. 3 the pin 4b then clasps behind the cam 6b. For opening, an unlocking plate 7 is placed on the lid 5 so that the formed tabs 7a and 7b come into contact with the corresponding sidewalls of the case, the permanent magnet 8b of the plate 7, as shown in FIG. 5, then being precisely located above the locking pin 4b in the sleeve 3b and urging the locking pin 4b into the release position due to it being magnetized in the opposite direction.

Figure 6:
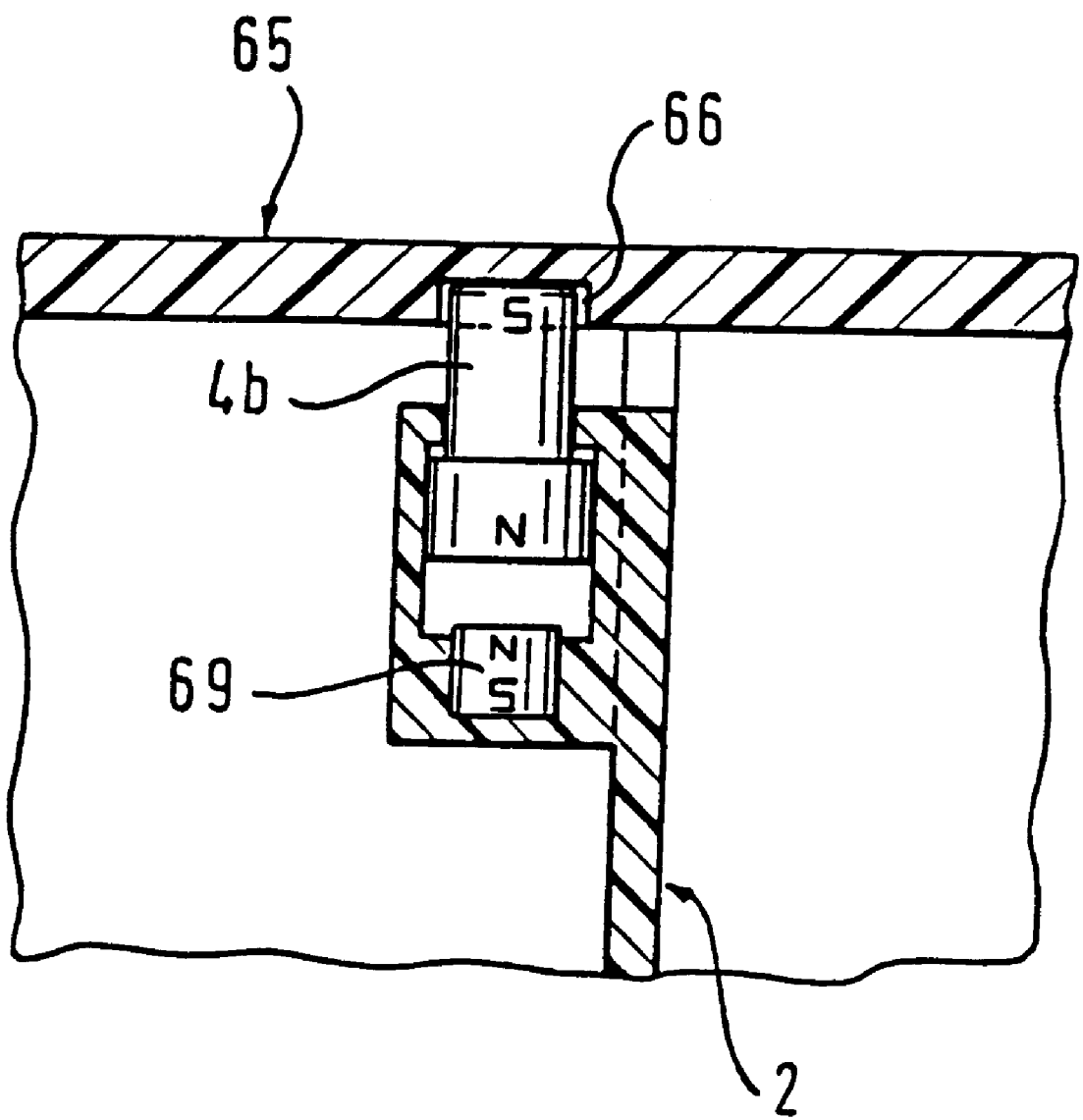
FIG. 6 is the same section as shown in FIG. 4 but showing another embodiment of the locking shoulder.

FIG. 6 shows another embodiment in which the force urging the locking pin into its locking position is produced not by means of a coil compression spring but by means of a permanent magnet 69 polarized in the opposite direction, cast or bonded in place in the sleeve 3b. In addition, the lid 65 comprises, instead of the cams 6a, 6b, blind holes 66 in which the locking pin 4b engages in the locking position. Since in this arrangement the spacing between the locking pin and the unlocking magnet 8b (cf. FIG. 5) in the unlocking plate 7 is significantly smaller than in the embodiment as described previously, permanent magnets can be employed in the unlocking plate 7 having comparatively less induction and can thus made of a cheaper permanent magnetic material.

While the invention has been illustrated and described as embodied in a closure device, it is not intended to be limited to the details shown since various modifications and structural changes may be made without departing in any way from the spirit of the present invention.

What is claimed as new and desired to be protected by letters patent is set forth in the appended claims:

What is claimed is:

1. A closure device for a case of an antimagnetic material, comprising a box part (1) and a sliding lid (5; 65) including at least one permanent magnetic locking pin (4a, 4b) slideable in said box part (1) at right angles to the plane of said lid (5; 65), loaded in said direction of said lid (5; 65), this locking pin (4a, 4b) clasping behind a locking shoulder (6a, 6b; 66) configured on the inner side of said lid when closed, wherein said lid (5) includes at two opposing longitudinal rims at least two laterally protruding tongues (5a) spaced away from each other respectively, and said box part is provided in corresponding sidewalls with recesses adapted to the depth and width of each tongue (5a), slide grooves (1b) receiving said tongues adjoining said recesses in the closing direction of said lid.

2. The device as set forth in claim 1, wherein said locking pin (4a, 4b) is received captive in an antimagnetic guide sleeve (3a, 3b) and said guide sleeve (3a, 3b) is formed integral with an antimagnetic web (2) suitable for sliding insertion into said box part.

3. The device as set forth in claim 1, wherein said locking shoulder on the inner side of said lid (5) comprises a flank of a cam (6a, 6b) protruding in the direction of the interior of said case and oriented at right angles to the surface area of said lid.

4. The device as set forth in claim 1, comprising a bevel on said lid which on sliding insertion movement of said lid urges said locking pin back into said box part until said cam flank has negotiated said locking pin.

5. The device as set forth in claim 1, wherein an unlocking plate (7) having at least two positioning means (7a, 7b) cooperating with said lid (5; 65) and a permanent magnet (8a, 8b) arranged opposing to the direction of magnetization of said locking pin can be mounted on said lid (5; 65).

6. The device as set forth in claim 1, comprising several locking pins incorporated magnetized partly with the same polarity and partly with opposing polarity relative to each other.

7. The device as set forth in claim 1, wherein a permanent magnet (69) active in opposite sense to the magnetizing direction of said locking pin (4b) is arranged in said guide sleeve.

* * * * *